United States Patent [19]
Baucom

[11] Patent Number: 5,813,793
[45] Date of Patent: Sep. 29, 1998

[54] SELF-LOCATING DUAL MOTION LOCKING APPARATUS FOR JOINING COMPUTER HOUSINGS

[75] Inventor: Allan Scott Baucom, Townsend, Mass.

[73] Assignee: Digital Equipment Corporation, Maynard, Mass.

[21] Appl. No.: 782,861

[22] Filed: Jan. 13, 1997

Related U.S. Application Data

[63] Continuation of Ser. No. 492,464, Jun. 19, 1995, abandoned.

[51] Int. Cl.⁶ .................................. H05K 5/02; F16B 1/04
[52] U.S. Cl. .......................... 403/325; 403/321; 292/127; 292/DIG. 37; 292/DIG. 61; 292/DIG. 63; 361/726; 361/732; 439/341; 439/352
[58] Field of Search ..................................... 403/321, 322, 403/325; 361/684–686, 681, 732, 726; 292/DIG. 37, DIG. 61, DIG. 63, 124, 127, 224; 439/341, 347, 352, 928

[56] References Cited

U.S. PATENT DOCUMENTS 5,434,743  7/1995  Hosoya et al. ........................... 361/686

FOREIGN PATENT DOCUMENTS 593242  4/1994  European Pat. Off. ............... 361/681

Primary Examiner—Anthony Knight
Attorney, Agent, or Firm—Krishnendu Gupta

[57] ABSTRACT

A locking mechanism for facilitating connection between a first housing and a second housing. The locking mechanism mounted in the mounting region of the second housing and includes a plunger mounted for movement up to an extended position, a biasing device urging the plunger toward the extended position, a catch spring, and a release button having a ramp, such release button being mounted on the second housing for back and forth movement in a direction transverse to the direction of the plunger and along a path that brings the ramp into contact with the catch spring when the release button is moved forward.

4 Claims, 4 Drawing Sheets

SELF-LOCATING DUAL MOTION LOCKING APPARATUS FOR JOINING COMPUTER HOUSINGS

This application is a continuation, of application Ser. No. 08/492,464, filed Jun. 19, 1995 now abandoned.

FIELD OF THE INVENTION

The present invention relates to the field of attaching and unattaching housings or enclosures, and more particularly to the field of computers where a variety of enclosures require attachment by mechanical mechanism.

BACKGROUND OF THE INVENTION

As is known in the art, electronic equipment such as computers, peripherals, and the like, are generally being reduced in overall size. Decreasing the size of computers and their associated peripherals provide a user with a powerful and flexible computing device that is flexible to configure and easy to transport. An example of such a computer system is referred to generally as a "laptop computer" or a "notebook computer".

As is also known, a notebook computer consists of a single system unit which includes a central processing unit (CPU), a keyboard, a liquid crystal display (LCD), several external connection ports, disk storage systems, and PCMCIA card ports. In addition, peripherals have been designed, such as CD-ROM storage systems and audio speakers, to attach to the basic system unit. With such an addition, the capabilities of the basic system are expanded.

It is also known that for expanded capabilities it is necessary to provide a mechanism for attaching and unattaching a peripheral, such as a multimedia option, and a notebook computer, that securely locks the two units to each other. Furthermore, the attachment mechanism should allow for easy joining and unjoining by easily locking units together and unlocking them.

One approach, for example, is to use two wire-type hoop fasteners which are attached to alternate edges of the system unit and snapped over corresponding alternate edges of the peripheral device. Such an arrangement is similar to the wire-type hoop fasteners used on wet-dry vacuum cleaners. But this approach increases the overall size of the complete system when the system unit is connected to the peripheral.

Another approach to this problem is to use hook-type fasteners. The hook-type fasteners are attached to the system unit's edges by a screw/spring arrangement which pivot and snap to the peripheral device. But this approach also increases the overall system size when the system unit is connected to the peripheral. In addition, such an arrangement can easily be disturbed by movements during use or transport and thus result in a premature unlocking and separation of the peripheral from the system unit.

Still another approach has been to use threaded screw-type fasteners to secure the peripheral device to the system unit. But this approach also has limitations; it precludes the user from making quick peripheral changes and thus reduces the overall system flexibility of being able to quickly interchange several peripherals with the system unit.

SUMMARY OF THE INVENTION

In accordance with the present invention, two housings capable of being attached and unattached including a first housing having a wall with a generally planar exterior surface and a locking opening at the exterior surface, the locking opening defining an engagement locking edge at its boundary, a second housing having a wall with a generally planar exterior surface and a plunger opening there through, the wall of the second housing further having a mounting region at the interior surface thereof associated with the plunger opening, the locking opening of the first housing and plunger opening of the second housing being aligned at attachment of the housing, and a locking mechanism mounted in the mounting region of the second housing. The locking mechanism includes a plunger mounted for movement up to an extended position and down to a retracted position in the plunger opening, the extended position being the unattached position and the retracted position being the attachment position, a biasing device urging the plunger toward the extended position, a catch spring including a lock catch section and a plunger release and hold down section, the lock catch section having an arm extending in the direction of the up and down movement of the plunger and an engagement lip on an end region of the arm extending laterally of the arm, the catch spring being mounted so that the arm extends through the plunger opening to place the engagement lip in spaced apart relationship with the external surface of the second housing, the plunger release and hold down section extending in a direction transverse to the movement of the plunger, the catch spring further including a biasing section urging the arm to place the engagement lip into interlocking engagement with the locking edge, the plunger further having a stepped member providing a hold down surface and a hold off surface, the hold off surface extending generally normal to the hold down surface, the plunger release and hold down section of the catch spring engaging the hold down surface of the stepped member of the plunger when the plunger is in the retracted position, the arm moving under the influence of the biasing section to place the engagement lip into interlocking engagement position with the locking edge of the locking opening of the first housing and allowing the plunger release and hold down section of the lock catch to move into engagement with the hold down surface of the plunger when the plunger is moved downwardly to the retracted position, the hold off surface of the stepped member to hold the arm so that the engagement lip is out of interlocking relationship with the engagement, and a release button having a ramp, such release button being mounted on the second housing for forward and rearward movement in a direction transverse to the up and down direction of the plunger and along a path bringing the ramp into contact with the biasing section of the catch spring when the release button is moved forward, such forward movement of the release button causing the ramp to move the catch spring to disengage the engagement lip from the engagement locking edge of the first housing and to disengage the plunger release and hold down section of the catch spring from the hold down surface of the plunger, the plunger being allowed to move under the influence of the biasing device to the extended position.

A peripheral device embodying the invention also allows for maximizing overall space of the connected systems and allows the blind attachment of the peripheral device to the system unit.

BRIEF DESCRIPTION OF THE DRAWINGS

The novel features believed characteristic of the invention are set forth in the appended claims. The invention itself, however, as well as other features and advantages there of, will be best understood by reference to the detailed description of specific embodiments which follows, when read in conjunction with the accompanied drawings, wherein:

DESCRIPTION OF PREFERRED EMBODIMENT(S)

Figure 1:
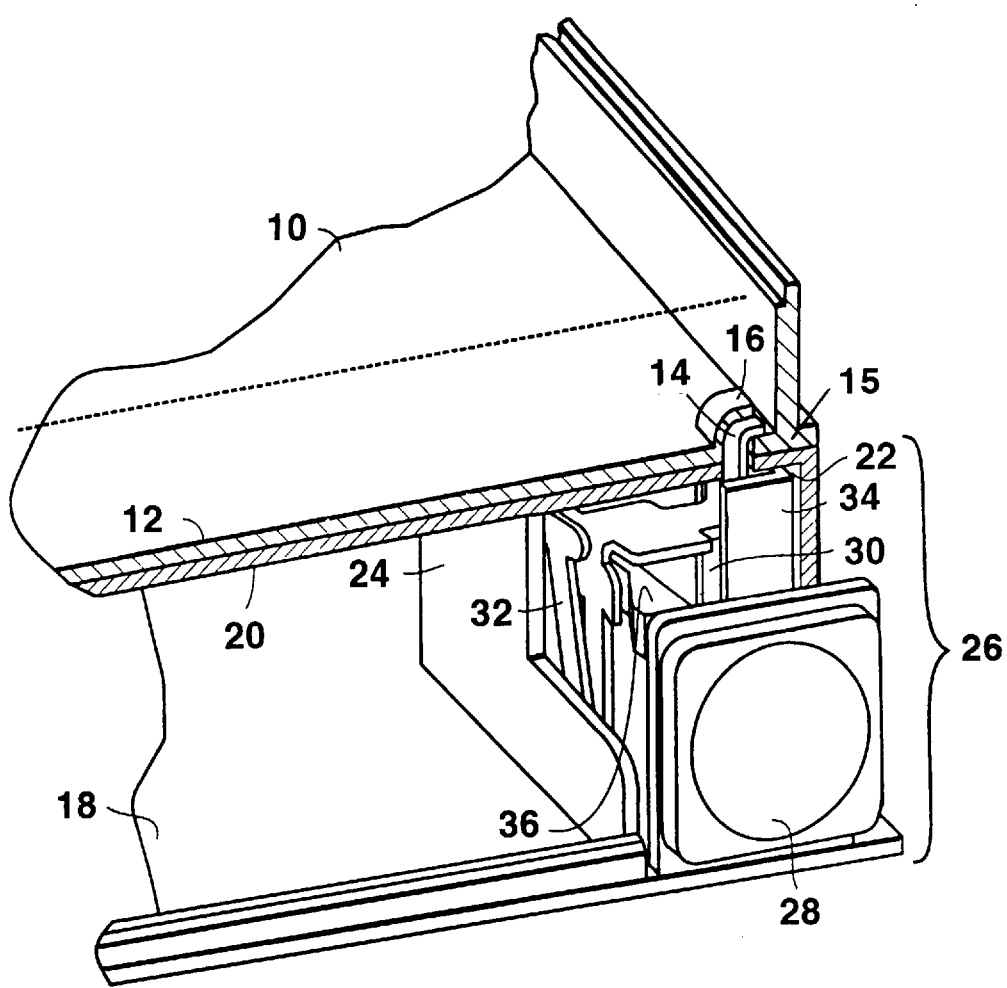
FIG. 1 is an isometric view of a locking mechanism in accordance with the present invention.

Referring now to FIG. 1, a first computer notebook housing (or upper housing) 10 is shown in cut-away view to have a generally planar exterior bottom surface 12 and a locking opening 14 formed therein defining a locking edge 15. The locking opening 14 is further shown to include a locking receipt wall 16 formed as an integral curved interior wall of the upper housing 10.

Also in FIG. 1 a second housing (or lower housing, shown as a multimedia option) 18 is shown to include a generally planar wall 20 and a plunger opening 22 formed therein. As shown in FIG. 1, the plunger opening 22 is aligned with the locking opening 14 so as to provide a means for attachment of the first housing 10 to the second housing 18. The second housing 18 is also shown as having a mounting region 24 wherein a locking mechanism 26 is housed. The locking mechanism 26 is shown to include a release button 28 with a ramp 30, a catch spring 32, and an elongated plunger 34.

As shown in FIG. 1, the upper housing 10 is attached to the lower housing unit 18 via the locking mechanism 26. As will be described more fully below, the catch spring 32 is engaged through the plunger opening 22 to the locking edge 15 in the locking opening 14 to attach the two housings. Thus, FIG. 1 illustrates the locking mechanism 26 in its or engaged or attachment position. To disengage the upper housing 10 from the lower housing 18, the release (or eject) button 28 is pressed. This results in the disengagement of the catch spring 32 upon contact with a ramp 36 against the catch spring 32 (more fully described below).

Figure 2:
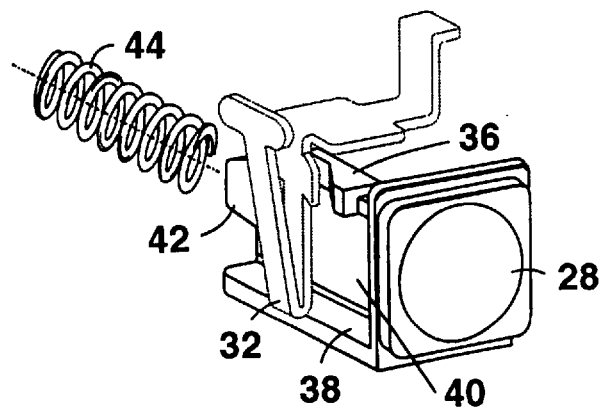
FIG. 2 is an exploded view of the release button of FIG. 1.

Referring now to FIG. 2, the release button 28 is shown to include a generally planar base region 38 extending from, and forming a base therefor, the release button 28. Extending upwardly from the base 38 in a perpendicular manner is a ramp/biasing support wall 40. At the rear of the ramp/biasing support wall 40 there is shown a seat 42 for receipt of a biasing device, such as a spring 44. The spring 44 acts to exert a force on the release button 28 through the ramp/biasing support wall 40 to urge the release button 28 to its open or rest position pressed against the interior surface within the mounting region 24 at an inside exterior wall of the lower housing 18.

The ramp/biasing support wall 40 is also shown to have the ramp 36 formed on its top edge. The ramp 36 is a wedged shape structure tapered toward the seat 42.

To illustrate more fully the operation of the release button 28 of the locking mechanism 26, the catch spring 32 (of FIG. 1) is shown in tandem. When the release button 28 is pressed the housing 38 and ramp/biasing support wall 40 with its ramp 36 move together forward horizontally to compress the spring 44. This forward motion causes the ramp 36 to come in contact with the biasing section 66 of the catch spring 32, thus forcing the catch spring 32 to back off or move in a motion perpendicular to the movement of the release button 28. And as will be more fully described below, as the catch spring 32 is caused to back off, the locking mechanism 26 (of FIG. 1) disengages the upper housing 10 from the lower housing 18.

Figure 3:
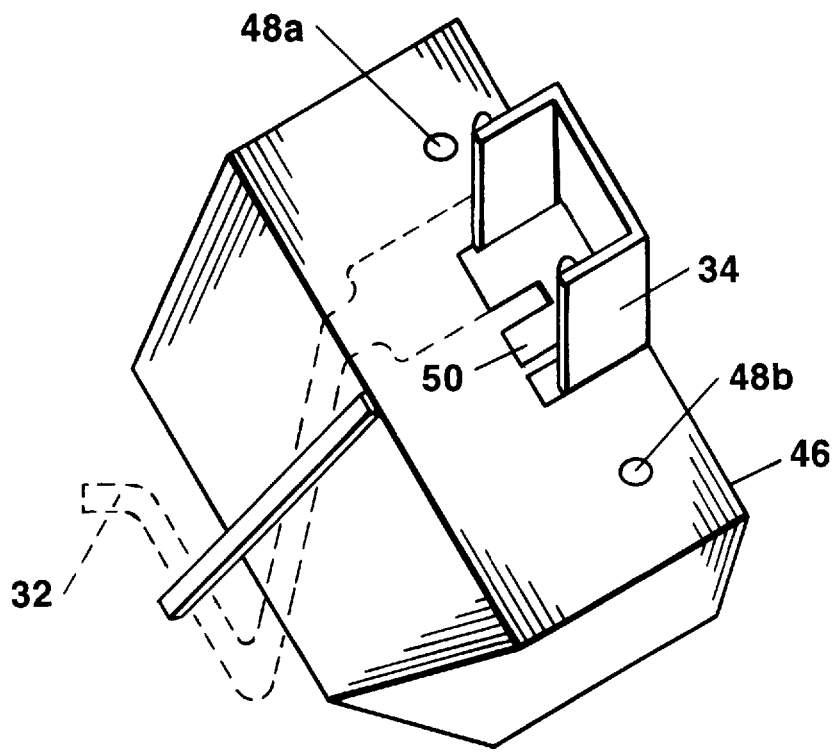
FIG. 3 is an exploded isometric view of the body of FIG. 1.

Referring to FIG. 3, the locking mechanism 26 (of FIG. 1) is secured within the mounting region 24 by a locking body 46. The locking body 46 is shown to include two openings, referred to as 48a and 48b, respectively, through which screw-type fixtures or the like (not shown) are placed to secure the locking mechanism body 46 to the interior side of the exterior wall 20 of the lower housing 18. An upper portion of the locking mechanism body 46 is further shown to have a U-shaped opening 50 through which the plunger 34 (of FIG. 1) may move in a motion generally perpendicular or vertically to the movement of the release button 28 (of FIG. 1).

The locking body 46 also includes a stop 52 for receipt of a biasing device, such as a spring 54. The end of the spring 54 opposite the stop 52 aligns with a bottom portion of the plunger 34 (more fully described with reference to FIG. 5). With such an arrangement, the spring 54 maintains a constant upward force on the plunger 34, urging the plunger 34 upwardly to its extended position in the plunger opening 22 (of FIG. 1).

Figure 4:
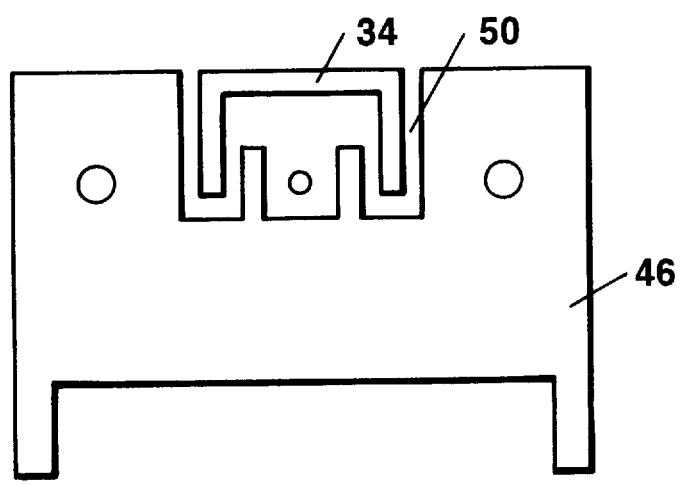
FIG. 4 is a top view of the body of FIG. 3.

Referring to FIG. 4, a top view of the locking mechanism body 46 illustrates how the U-shaped opening 50 conforms to the shape of the plunger 34.

Figure 5:
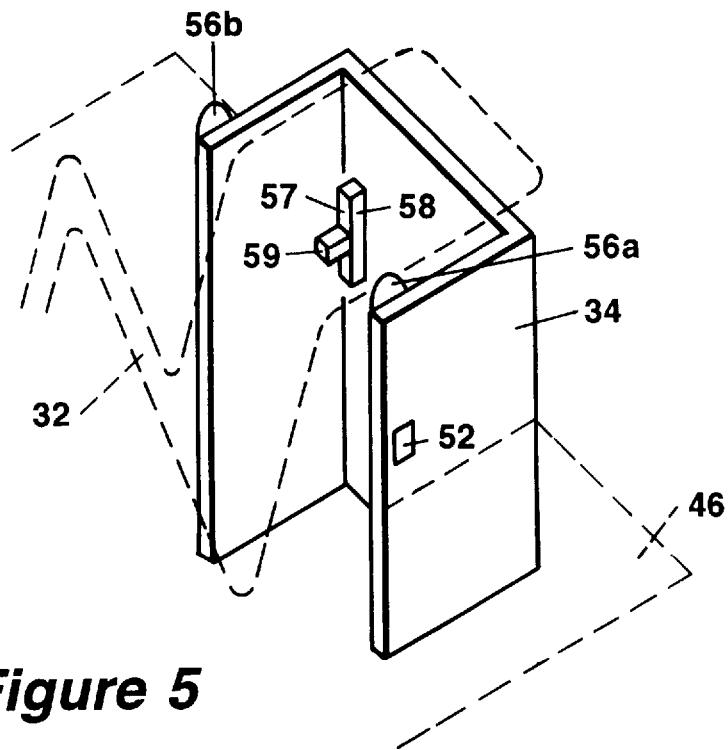
FIG. 5 is an isometric view of the plunger of FIG. 1.

Referring to FIG. 5, the locking mechanism body 46 is shown to provide a seat and isolation for guiding the movement of the plunger 34 in a direction generally perpendicular to the release button 28 (of FIG. 1). As shown, the plunger 34 is elongated and has a U-shaped structure in transverse cross section and has two locator tips, labeled as 56a and 56b, respectively. The locator tips 56a and 56b, when the plunger 34 is extended fully upward, provide an aid to locating and positioning the catch spring 32 within the locking opening 14 of the upper housing 10.

The U-shape of the plunger 34 is designed such that it cannot enter the locking opening 14 of the upper housing 10. Rather, when the upper housing 10 is placed on the lower housing 18, the upper housing 10 forces the plunger 34 down to its retracted position, thus exposing the catch spring 32 and resulting in inter-engagement of the engagement lip 70 with the engagement edge 15 of the locking mechanism 26.

As can be seen in FIG. 5, one end of the catch spring 32 is shaped to fit inside the U-shape of the plunger 34.

On the inside wall of the plunger 34 there is shown a step fixture or member 58 including a high step or hold surface 57 and a holdoff surface 59. A lock catch section 60 of the catch spring 32 (more fully described with reference to FIG. 6) is designed to make contact with the step fixture 58.

When the plunger 34 is in its upward extended position an arm 68 of the catch spring 32 is pressing against the holdoff surface 59 of the step fixture 58; this results in the catch spring 32 being in a backoff (or rest) position, ie., disengagement.

When the plunger 34 is in its downward extended position the arm 68 of the catch spring 32 is pressing against the hold surface 57 of the step fixture 58; this results in the catch spring 32 being in a forward (or locking) position, ie., engagement. Thus, when the plunger 34 is extended upwardly, the catch spring 32 is pushed back and hidden by the plunger 34; this is the disengagement position. When the plunger 34 is moved downwardly, the catch spring 32 is allowed to move forward and not be shielded by the body of the plunger 34; this is the engagement position. Thus, when the plunger 34 is in an up position, the catch spring 32 is prevented from becoming engaged. Correspondingly, when the plunger 34 is in a down position, the catch spring 32 is allowed to become engaged.

The lower or bottom end of the step fixture 58 also provides for receipt of the spring 54 (of FIG. 3). The spring 54 is seated on the stop 52 of the locking mechanism body 46 (of FIG. 3).

Figure 6:
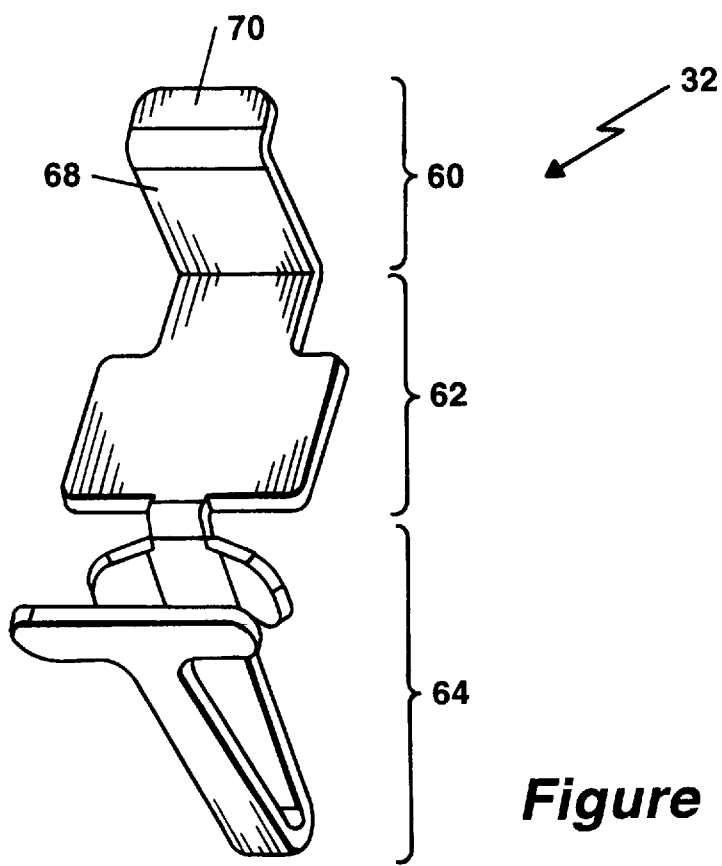
FIG. 6 is an detailed view of the catch spring of FIG. 1.

Referring now to FIG. 6, the catch spring 32 is shown to include a lock catch section 60, a plunger release and hold down section 62, and a biasing section 64.

The lock catch section 60 is further shown to include the arm 68 in the direction of the up and down movement of the plunger 34 (of FIG. 3) and the engagement lip 70 on an end region of the arm 68. The catch spring 32 is mounted so that the arm 68 extends upwardly in the recess of the U-shape of the plunger 34 (of FIG. 1) to place the engagement lip 70 in a spaced apart relationship with the external surface of the lower housing 18.

The plunger release and hold down section 62 of the catch spring 32 is shown extending in a direction transverse to the movement of the plunger 34 and transverse to the lock catch section 60. The lock catch section 60 is designed to engage the step fixture 58.

The biasing section 64 is a spring section bent back on itself so that the section provides a force urging the lock catch section 60 against the step fixture 58 of the plunger 34 when the plunger 34 is in its retracted position. The biasing section 64 also provides a means to retract the lip 70 of the lock catch section 60 from the engagement locking edge 15 upper housing when the ramp 36 of the release button 28 is pressed against it.

Figure 7:
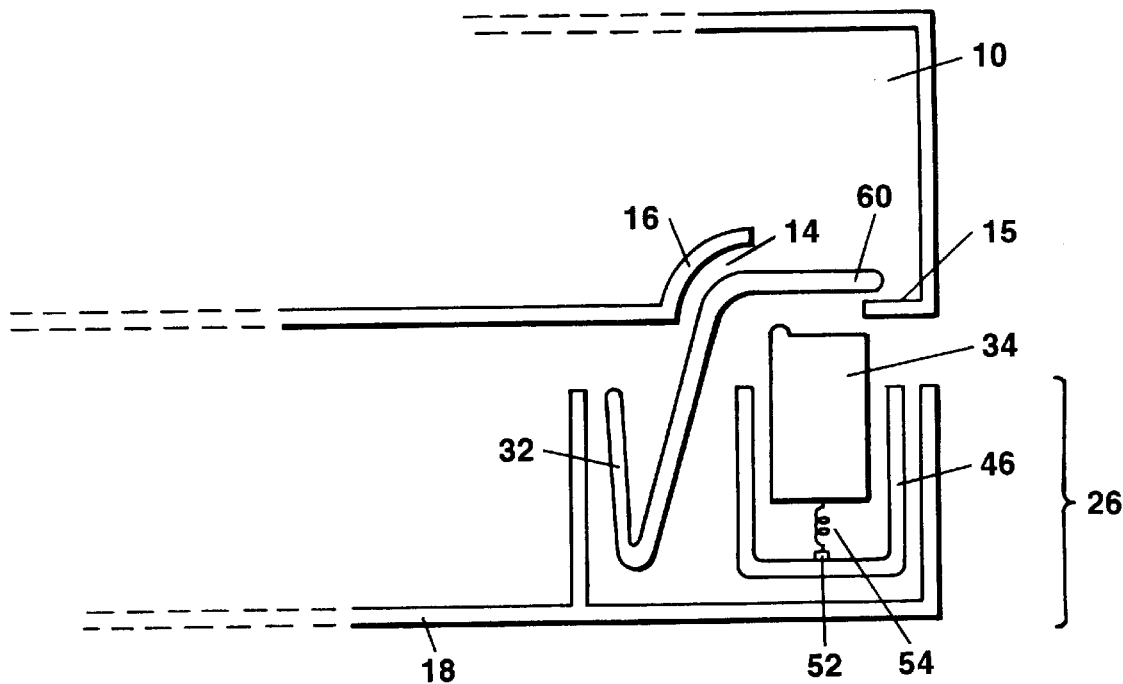
FIG. 7 is a cross-sectional view of the locking mechanism of FIG. 1 in the engaged position.

Referring now to FIG. 7, a cross section of the upper housing 10 engaged to the lower housing 18 by the locking mechanism 26 is shown. In FIG. 7, the engagement lip 70 is shown forced toward and seated within the locking opening 14 as a result of the plunger 34 being in a downward position and the force provided by the biasing section 66 of the catch spring 32 when the exterior wall 12 of the upper housing 10 is placed and pressed onto the exterior wall 20 of the lower housing 18. Thus, the placement of the upper housing 10 upon the lower housing 18 forces the plunger 34 downwardly, thus exposing the engagement lip 70.

Figure 8:
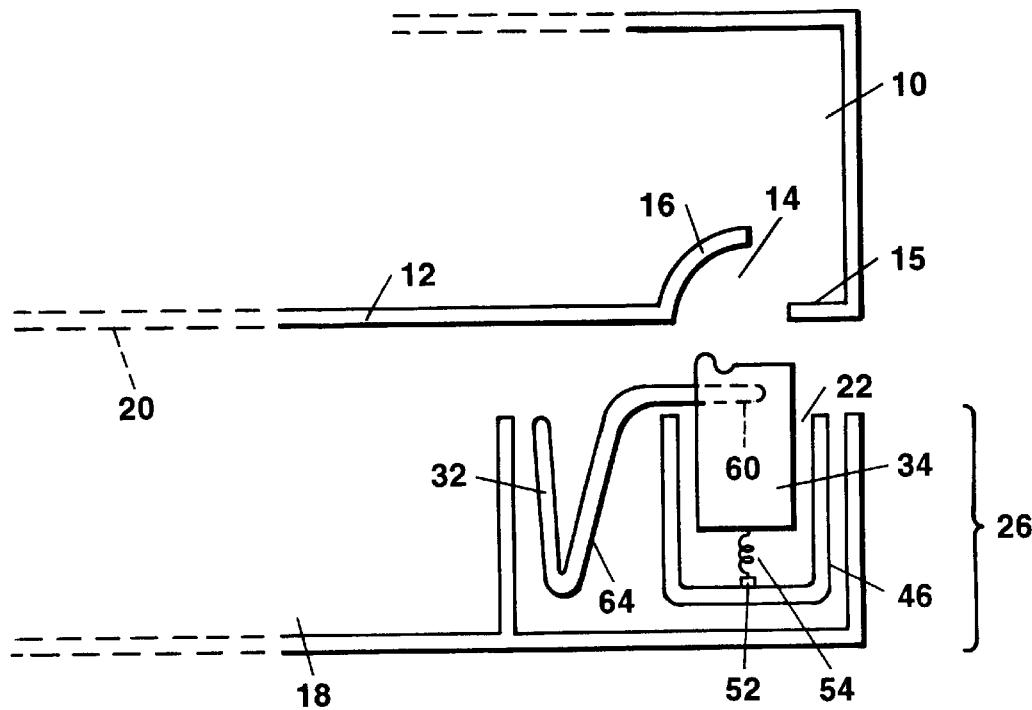
FIG. 8 is a cross-sectional view of the locking mechanism of FIG. 1 in the disengaged position.

Referring now to FIG. 8, a cross section of the upper housing 10 disengaged to the lower housing 18 by the locking mechanism 26 is shown. The biasing section 64 of the catch spring 32 has been forced away from the plunger 34 by the ramp 36 (not shown). This allows the plunger 34 to move upwardly toward the exterior wall 12 of the upper housing 10, releasing the lower housing 18 from the upper housing 10 and shielding the engagement lip 60 of the catch spring 32.

Having described a preferred embodiment of the invention, it will now become apparent, to one of skill in the art that other embodiments incorporating its concepts may be used. It is felt therefore, that this embodiment should not be limited to the disclosed embodiment, but rather should be limited only by the spirit and scope of the appended claims.

What is claimed:

1. Two housings capable of being attached and unattached comprising:

a first housing having a wall with a generally planar exterior surface and a locking opening at the exterior surface, the locking opening defining an engagement locking edge at its boundary;

a second housing having a wall with a generally planar exterior surface and a plunger opening there through, the wall of the second housing further having a mounting region at the interior surface thereof associated with the plunger opening, the locking opening of the first housing and plunger opening of the second housing being aligned at attachment of the housing; and a locking mechanism mounted in the mounting region of the second housing, such mechanism including:

a plunger mounted for movement up to an extended position and down to a retracted position in the plunger opening, the extended position being the unattached position and the retracted position being the attachment position;

a biasing device urging the plunger toward the extended position;

a catch spring including a lock catch section and a plunger release and hold down section, the lock catch section having an arm extending in the direction of the up and down movement of the plunger and an engagement lip on an end region of the arm extending laterally of the arm, the catch spring being mounted so that the arm extends through the plunger opening to place the engagement lip in spaced apart relationship with the external surface of the second housing, the plunger release and hold down section extending in a direction transverse to the movement of the plunger, the catch spring further including a biasing section urging the arm to place the engagement lip into interlocking engagement with the locking edge, the plunger further having a stepped member providing a hold down surface and a hold off surface, the hold off surface extending generally normal to the hold down surface, the plunger release and hold down section of the catch spring engaging the hold down surface of the stepped member of the plunger when the plunger is in the retracted position, the arm moving under the influence of the biasing section to place the engagement lip into interlocking engagement position with the locking edge of the locking opening of the first housing and allowing the plunger release and hold down section of the lock catch to move into engagement with the hold down surface of the plunger when the plunger is moved downwardly to the retracted position, the hold off surface of the stepped member to hold the arm so that the engagement lip is out of interlocking relationship with the engagement; and a release button having a ramp, such release button being mounted on the second housing for forward and rearward movement in a direction transverse to the up and down direction of the plunger and along a path bringing the ramp into contact with the biasing section of the catch spring when the release button is moved forward, such forward movement of the release button causing the ramp to move the catch spring to disengage the engagement lip from the engagement locking edge of the first housing and to disengage the plunger release and hold down section of the catch spring from the hold down surface of the plunger, the plunger being allowed to move under the influence of the biasing device to the extended position.

2. The two housings according to claim 1 wherein the plunger is elongated and U-shaped in transverse cross-section.

3. The two housings according to claim 2 wherein the biasing device urging the plunger toward the extended position is a spring.

4. The two housings according to claim 1 wherein the biasing section of the catch spring includes a portion of such spring bent back on itself.

\* \* \* \* \*